(12) United States Patent
Shih et al.

(10) Patent No.: US 7,332,435 B2
(45) Date of Patent: Feb. 19, 2008

(54) SILICIDE STRUCTURE FOR ULTRA-SHALLOW JUNCTION FOR MOS DEVICES

(75) Inventors: Chien-Hsueh Shih, Taipei (TW); Shih-Wei Chou, Taipei (TW); Hung-Wen Su, Jhubei (TW); Minghsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 384 days.

(21) Appl. No.: 11/072,038

(22) Filed: Mar. 4, 2005

(65) Prior Publication Data
US 2006/0205214 A1    Sep. 14, 2006

(51) Int. Cl.
*H01L 21/44* (2006.01)

(52) U.S. Cl. ............... 438/686; 257/757; 257/768; 257/E21.165; 257/E29.111; 438/656

(58) Field of Classification Search ................ 438/686, 438/656, 233; 257/E21.165, E29.111, 757, 257/768, 587, 47
See application file for complete search history.

(56) References Cited

U.S. PATENT DOCUMENTS

| | | | |
|---|---|---|---|
| 6,369,429 B1 * | 4/2002 | Pramanick et al. | ......... 257/382 |
| 6,426,291 B1 | 7/2002 | Hu et al. | |
| 2006/0003534 A1 * | 1/2006 | Roh et al. | ......... 438/300 |

* cited by examiner

*Primary Examiner*—Caridad Everhart
(74) *Attorney, Agent, or Firm*—Slater & Matsil, L.L.P.

(57) ABSTRACT

A method of forming a semiconductor device comprising: forming a gate dielectric layer over a channel region; forming a gate electrode on the gate dielectric layer; forming source/drain regions substantially aligned with respective edges of the gate electrode with the channel region therebetween; forming a thin metal layer on the source/drain regions; forming a metal alloy layer on the thin metal layer; and transforming the thin metal layer into a low resistance metal silicide.

18 Claims, 3 Drawing Sheets

SILICIDE STRUCTURE FOR ULTRA-SHALLOW JUNCTION FOR MOS DEVICES

TECHNICAL FIELD

This invention relates generally to semiconductor devices, and more specifically to silicide structure for MOS devices.

BACKGROUND

Deep-submicron scaling required for VLSI systems dominates design considerations in the microelectronics industry. As the gate electrode length is scaled down, the source and drain junctions must be scaled down accordingly to suppress the so-called short channel effects (SCE) that degrade performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, parasitic series resistances of the source/drain diffusion layers and polysilicon gate electrodes increase. A conventional approach to the increase in parasitic series resistances of the source/drain diffusion layers and the polysilicon gate electrodes involves salicide technology which comprises forming a layer of metal silicide on the source/drain regions and gate electrode.

Conventional salicide technology for reducing parasitic series resistance has proven problematic, particularly as design rules plunge into the deep-submicron range, such as about 0.18 microns and under. For example, agglomeration causes silicide to have high sheet resistance.

It can be appreciated from the geometry of a MOS device that smaller device sizes, in particular a shorter distance between the source and drain, will allow the conducting channel between the source and drain to form more rapidly and allow the device to operate at higher switching speeds. As the device dimensions are reduced to achieve higher packing densities and improved performance, the junction depth needs to be scaled in proportion to the junction length. However, the formation of silicide consumes crystalline silicon from the underlying semiconductor substrate. When the junction depth is significantly smaller than the thickness of the silicide, the thickness variation of the silicide caused by process variations may be greater than the junction depth, making the junction depth very hard to control.

Various approaches have been taken to solve the above-mentioned problems. In a first attempt, a thin layer of Cobalt-tungsten alloy is selectively deposited on the source/drain (S/D) silicon layer. The Cobalt-tungsten alloy layer acts as a silicide barrier layer. A Nickel or Cobalt layer is formed on the Cobalt-tungsten alloy layer. With the presence of the silicide barrier layer, the silicide formation is hampered at the interface between the S/D silicon and the silicide barrier layer, and there is little consumption of silicon from the underlying substrate or gate electrode. Therefore, the ultra-shallow junction can be formed without encountering junction leakage. However, the Cobalt-tungsten alloy has high resistivity, which degrades the overall junction performance. Additionally, It is not easy to control tungsten concentration in the Cobalt-tungsten alloy.

In another approach, a Cobalt layer doped with phosphorous is blanket deposited on the S/D silicon layer. A silicide control layer of titanium is formed on the doped Cobalt layer. An annealing or rapid thermal processing process is performed. The titanium layer partially alloys with the previously deposited Cobalt layer in the annealing step. The alloying of the titanium and Cobalt binds up or getters a portion of the deposited Cobalt. The titanium-Cobalt alloy does not readily react with the underlying silicon to form a silicide. This helps to control the thickness of silicide formed in a subsequent salicide process. The un-silicided Cobalt reacts with the S/D silicon to form a Cobalt silicide. The remaining titanium and titanium-Cobalt alloy, including those over the S/D regions and over other regions, are then removed with a wet etching process. Through this conventional embodiment, a low resistance contact is formed and the leakage is well controlled. However, extra steps have to be taken to remove the titanium and titanium-Cobalt alloy.

Accordingly, there exists a need for alternative technology that enables a reduction in parasitic series resistance without causing junction leakage. There exists a particular need for simplified methodology for forming low resistance contacts in semiconductor devices with increased reliability, reduced junction leakage, and high transistor speed.

SUMMARY OF THE INVENTION

The preferred embodiments of the present invention present a semiconductor device having a novel silicide structure and a method of forming the same.

In accordance with one aspect of the present invention, the method of forming semiconductor device includes forming a gate dielectric layer on a substrate over the channel region; forming a gate electrode on the gate dielectric layer; forming source/drain regions in the substrate with a channel region therebetween; forming a thin metal layer on the source/drain regions; and forming a metal alloy layer on the metal layer. The thin metal layer forms a thin silicide layer with the underlying silicon. Since the metal layer is thin, silicon consumption is well controlled. The overlying metal alloy layer, which acts as a reaction barrier layer, prevents further silicidation and thus the junction leakage is prevented. The silicidation process is affected by impurities in the metal alloy layer. Less high-resistance silicide is formed so that the overall contact resistance is decreased.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A semiconductor device having a novel silicide structure and a method of forming the same is discussed in subsequent paragraphs. The intermediated stages of manufacturing preferred embodiments of the present invention are illustrated. Throughout the various views and illustrative embodiments of the present invention, like reference numbers are used to designate like elements.

Figure 1:
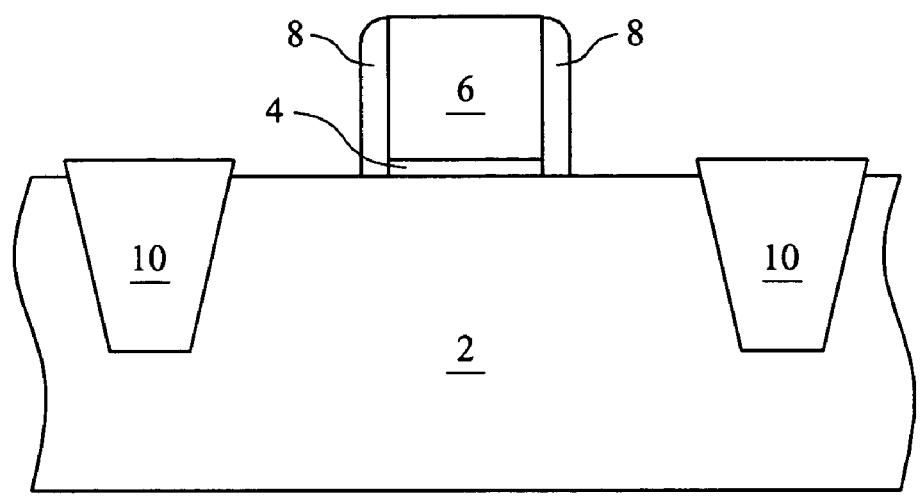
FIGS. 1 through 6 are cross-sectional views of intermediate stages in the manufacture of a preferred embodiment of the present invention.

FIG. 1 illustrates the formation of shallow trench isolations (STI) 10 and a gate structure in substrate 2. In the preferred embodiment, substrate 2 is a silicon substrate. In other embodiments, substrate 2 is a virtual substrate where a layer of relaxed SiGe is formed on graded SiGe, and a layer of strained Si is formed on relaxed SiGe. This structure can provide a tensile stress to the channel of the device and enhances carrier mobility of nMOS devices. In yet other embodiments, bulk semiconductor, strained semiconductor, compound semiconductor, multi-layers semiconductor or silicon on insulator (SOI), strained silicon-on-insulator (SSOI), strained silicon germanium on insulator (S-SiGeOI), silicon germanium on insulator (SiGeOI), and germanium on insulator (GeOI) can be used as substrate 2. STIs 10 are formed in the substrate 2. Preferably, the STIs 10 are formed by etching shallow trenches in the substrate 2 and filling the trenches with an insulator such as silicon oxide.

A gate dielectric 4 is deposited on the surface of substrate 2. The gate dielectric 4 may preferably be oxide. The forming method can be any of the known methods, such as local oxidation of silicon (LOCOS), chemical vapor deposition (CVD), etc. Silicon nitride can also be used since it is an effective barrier to impurity diffusion. The silicon nitride film is preferably formed by thermal nitridation of silicon. It can also be prepared by plasma anodic nitridation using nitrogen-hydrogen or thermal nitridation of $SiO_2$. The gate dielectric 4 may also be oxy-nitride, oxygen-containing dielectric, nitrogen-containing dielectric, high-k materials or combinations thereof.

A gate electrode 6 is formed on the gate dielectric 4. The gate electrode 6 is preferably polysilicon, although it may be formed of metal, or a compound structure including metal, semiconductor, metal oxide, and silicide. The preferred method of formation is CVD. The polysilicon has the ability of being used as a mask to achieve minimum gate-to-source/drain overlap. This in turn enhances the device performance. The polysilicon is then doped to reduce sheet resistance. Other embodiments may use amorphous silicon, elemental metals that are conductive, alloys of elemental metals that are conductive, silicides or nitrides of elemental metals that are conductive or combinations thereof. Typically, the gate electrode 6 and the gate dielectric 4 are deposited as layers and then patterned to form a gate.

A pair of spacers 8 is formed along sidewalls of the gate dielectric 4 and gate electrode 6. As known in the art, spacers 8 are preferably formed by blanket depositing a dielectric layer over entire region, then anisotropically etching to remove dielectric material from horizontal surfaces and leaving spacers 8. Spacers 8 may be formed of a single dielectric layer, as shown, or of a composite of several dielectric layers. FIG. 1 illustrates rectangle-like spacers. In another embodiment, spacers 8 can also be L-shaped. The formation of which is known in the art.

Figure 2:
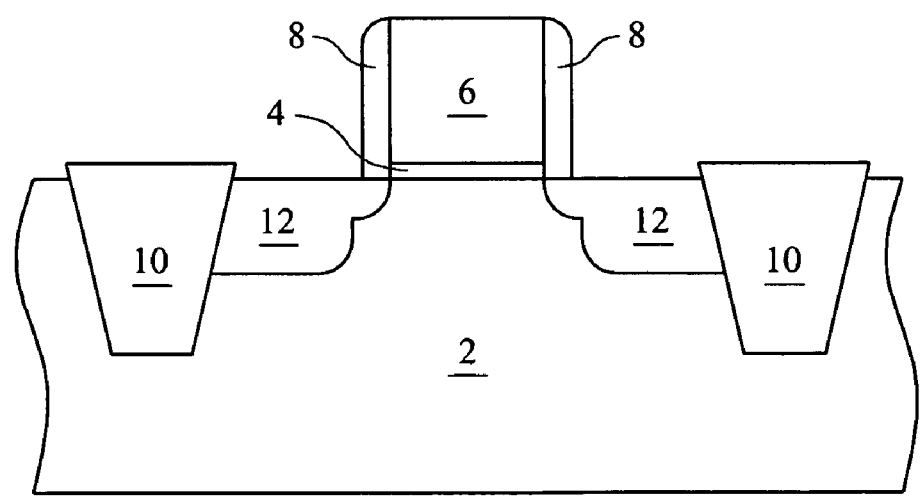

FIG. 2 also illustrates the formation of source/drain regions 12. In the preferred embodiment, the source/drain regions 12 are formed by implanting impurities into the semiconductor substrate 2. The spacers 8 are used as a mask so that the edges of the source/drain regions 12 are substantially aligned with the spacer 8. The gate electrode 6 is preferably implanted simultaneously to reduce sheet resistance. In other embodiments, the source/drain regions 12 are formed by recessing the source/drain regions followed by epitaxially growing simiconductor materials, such as silicon, in the recesses with desired dopant. In yet other embodiments, source/drain regions 12 are formed by expitaxially growing silicon with desired dopant on the substrate 2. Preferably, a $SiO_2$ film is formed in regions where no source and drain are to be formed. The subsequently deposited silicon on $SiO_2$ film will be in the form of poly-crystal and is selectively removed. In source/drain regions, single crystal is grown.

Figure 3:
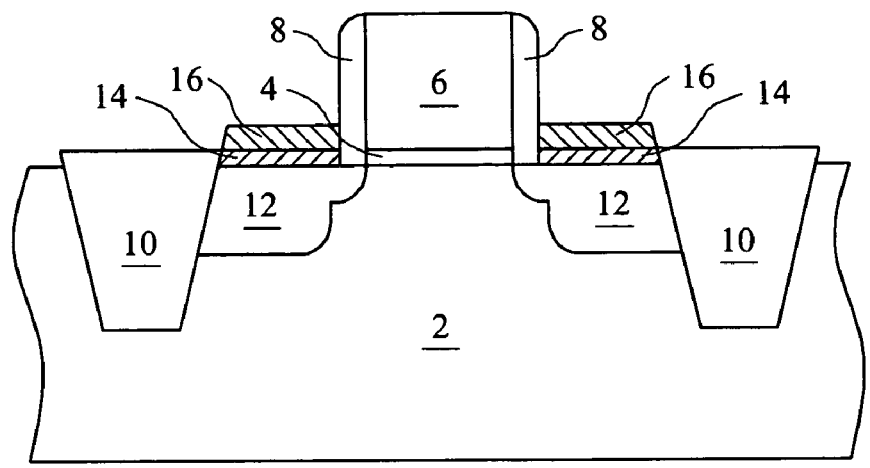
Figure 4:
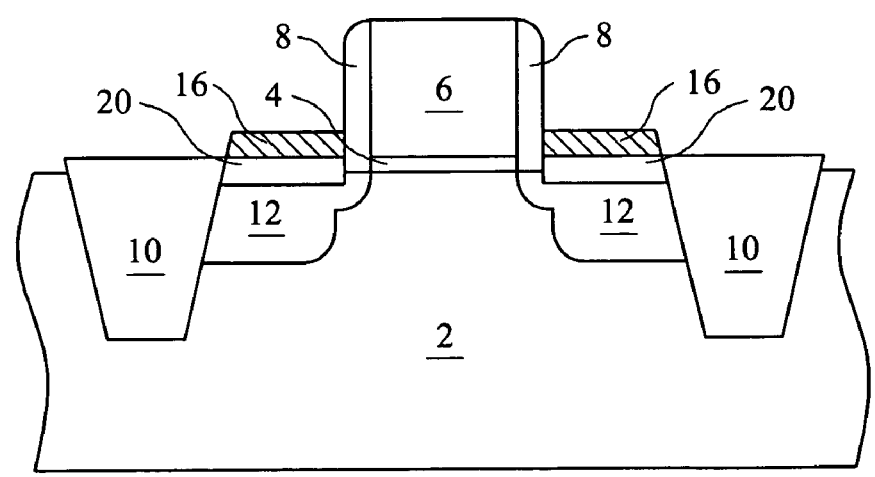

A thin layer of metal 14, preferably formed of Cobalt (Co) or Nickel (Ni), is selectively deposited on the source/drain regions 12, as shown in FIG. 3. The preferred method of deposition is electroless plating, which can selectively form metal layer on the source and drain regions 12, but not the dielectrics, such as gate spacers 8. The selective deposition on the metal layer 14 can be performed by adjusting the plating parameters, such as adjusting the pH value of the plating solution and the temperature of the plating process. For example, for selectively plating Nickel, the pH value of the plating solution is preferably between about 7 and about 9.5, and the temperature is preferably between about 60° C. and about 98° C. In an exemplary Nickel electroless plating process, the plating solution comprises 98% Nickel (or Cobalt), about 1% to about 2% Phosphorus, and less than about 1% Boron. DMAB (Dimethylamine-borane) and Hypophosphite can be used as the reducing agent. The metal layer 14 has a preferred thickness of between about 10 Å and about 50 Å, more preferably about 20 Å.

FIG. 3 also illustrates a selective deposition of metal alloy layer 16 on the metal layer 14. The metal alloy layer 16 is preferably a Cobalt alloy or a Nickel alloy formed by electroless plating. It also comprises impurities such as phosphorus, boron, palladium, tungsten, molybdenum, and rhenium. In an exemplary plating process, corresponding to the metal and impurities desired, the plating solution may comprise about 90 to 95% Nickel (or Cobalt), about 5% t to about 10% Phosphorous, and about 1% to about 2% Boron. DMAB (Dimethylamine-borane) and Hypophosphite can be used as the reducing agent. The electroless plating is performed at a temperature of between about 60° C. and about 98° C. In order to reduce the resistivity, the metal alloy layer 16 preferably has a higher concentration of Cobalt or Nickel, more preferably higher than about 90 atomic percent. The thickness of the metal alloy layer 16 is preferably less than about 150 Å, more preferably less than about 100 Å.

In another embodiment, the metal layer 14 and metal alloy layer 16 can be formed using other commonly used methods, such as plasma enhanced chemical vapor deposition (PECVD), atomic layer deposition (ALD), and low pressure CVD (LPCVD), etc. A selective etch is performed to remove the undesired portions and only portions on the source/drain regions 12 are left.

The introduction of the impurities such as palladium, tungsten, and molybdenum into the metal alloy layer 16 increase thermal stability of the metal silicide. It affects the annealing process probably from two aspects. First, the diffusion of metal (Cobalt or Nickel) is retarded and this decreases the silicidation process. Second, the impurities affect the phase transition of the silicide. For example, when Nickel silicide is formed, the silicide may comprise NiSi, $NiSi_2$ and the combinations. $NiSi_2$ has much higher resistivity than NiSi and it is an undesired form of silicide. NiSi tends to be formed at lower temperatures, and $NiSi_2$ tends to be formed at higher temperatures. The forming temperature difference of NiSi and $NiSi_2$ are typically between about 100° C. and 200° C. However, with the addition of palladium, tungsten, or molybdenum, the forming temperature difference increases. In certain cases, about 300° C. of temperature difference is observed. Therefore, it is easier to control the annealing so that less $NiSi_2$ is formed.

The metal layer 14 forms silicide 20 with the underlying silicon during a subsequent annealing, as illustrated in FIG.

4. Since the metal layer 14 is very thin, the resulting silicide 20 is also very thin. The silicide layer 20 formed is preferably between about 10 Å and about 50 Å, more preferably about 20 Å. In the preferred embodiment, less high-resistivity silicide is formed. Taking Nickel as an example, typically, only less than about 10% of the silicide is $NiSi_2$, and the remaining is NiSi. Therefore, 100 Å of Nickel silicide equivalently has about 10 Å $NiSi_2$ and 90 Å NiSi. The combination of thin silicide layer and less $NiSi_2$ creates a silicide 20 with low sheet resistance.

Due to the addition of boron or phosphorus, the metal alloy layer 16 is kept from reacting with silicon and, thus, it acts as a reaction barrier layer. Silicon mainly reacts with Nickel or Cobalt in the metal layer 14. Since the metal layer 14 is thin, the consumption of silicon is well controlled, and junction leakage due to the silicidation is avoided. This is especially advantageous for small devices with ultra-shallow junctions.

Figure 5:
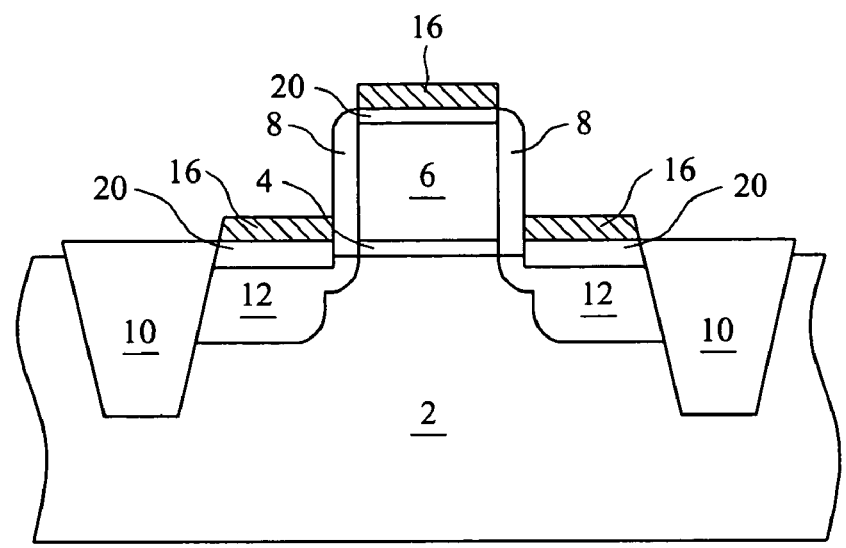

The previously discussed silicidation process also applies to the gate electrode 6 if it is formed of polysilicon. The structure is shown in FIG. 5. At the time the metal layer 14 and metal alloy 16 is formed on the source/drain regions 12, the same layers are also formed on the polysilicon gate electrode 6. Due to different characteristics of the polysilicon gate electrode 6 and single crystal source/drain regions 12, the thickness of the metal silicide layer 20 on the gate electrode 6 may be different from what is on the source/drain regions 12. However, the thickness of the metal silicide layer 20 on the gate electrode 6 is not critical and small variations will not affect the device performance significantly.

Figure 6:
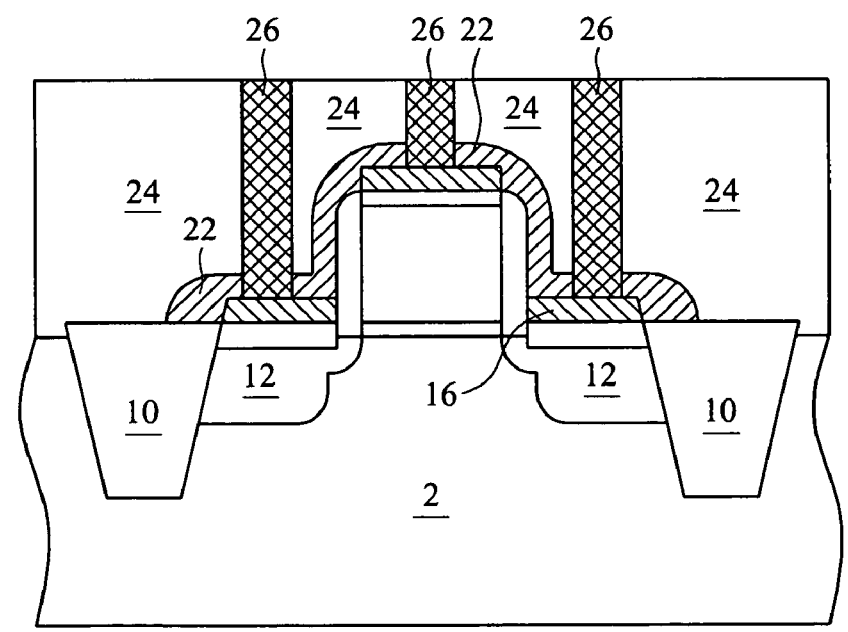

FIG. 6 illustrates the formation of a (contact) etch stop layer 22 (ESL), an inter-layer dielectric (ILD) 24, and contact plugs 26. ESL 22 is blanket deposited to cover the entire device, including source, drain, and gate. This layer typically serves two purposes: First, it provides a stress to the device and enhances carrier mobility. Second, it acts as an etch stop layer to protect underlying regions from being over etched. Next, an inter-layer dielectric (ILD) 24 is deposited over the surface of ESL 22. Contact plugs 26 are then made through the ILD 24.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
    forming a gate dielectric layer on a substrate and over a channel region;
    forming a gate electrode on the gate dielectric layer;
    forming a source/drain region substantially aligned with an edge of the gate electrode with the channel region therebetween; and
    forming a composite contact layer on the source/drain region, wherein the forming the composite contact layer comprises:
        forming a metal layer on an unsilicided portion of the source/drain region;
        forming a metal alloy layer on the metal layer; and
        transforming the metal layer into a low resistance metal silicide.

2. The method of claim 1 further comprising:
    simultaneously forming the metal layer on the gate electrode when the metal layer is formed on the source/drain region;
    simultaneously forming the metal alloy layer on the metal layer that is on the gate electrode when the metal alloy layer is formed on the metal layer that is on the source/drain region; and
    simultaneously transforming the metal layer on the gate electrode into an additional low resistance metal silicide when the metal layer on the source/drain region is transformed.

3. The method of claim 1 wherein the forming the metal layer and the forming the metal alloy layer comprises selective electroless plating.

4. The method of claim 3 wherein the electroless plating is performed in a plating solution, the plating solution having a pH value of between about 7 and about 9.5, and a temperature of between about 60° C. and about 98° C.

5. A semiconductor device comprising:
    a substrate having a channel region;
    a gate dielectric layer overlying the channel region;
    a gate electrode overlying the gate dielectric layer;
    source/drain regions substantially aligned with respective edges of the gate electrode with the channel region therebetween; and
    a composite contact layer on the source/drain regions, the composite contact layer comprising:
        a silicide layer; and
        a metal alloy layer on the silicide layer, the metal alloy layer comprising a material selected from the group consisting essentially of phosphorus, boron, palladium, tungsten, molybdenum, rhenium, and combinations thereof.

6. The semiconductor device of claim 5 wherein the silicide layer comprises a metal selected from the group consisting essentially of Cobalt and Nickel.

7. The semiconductor device of claim 5 wherein the silicide layer has a thickness of less than about 50 Å.

8. The semiconductor device of claim 5 wherein the metal alloy layer comprises a metal selected from the group consisting essentially of Cobalt and Nickel.

9. The semiconductor device of claim 5 wherein the metal alloy layer has a Cobalt or Nickel concentration of higher than about 90 atomic percent.

10. The semiconductor device of claim 5 wherein the metal alloy layer has a thickness of less than about 150 Å.

11. The semiconductor device of claim 5 further comprising:
    the silicide layer on the gate electrode; and
    the metal alloy layer on the silicide layer that is on the gate electrode.

12. A semiconductor device comprising:
    a substrate having a channel region;
    a gate dielectric layer overlying the channel region;
    a gate electrode overlying the gate dielectric layer;

source/drain regions substantially aligned with respective edges of the gate electrode with the channel region therebetween; and
a composite contact layer on the source/drain regions, the composite contact layer comprising:
a silicide layer, wherein the silicide layer is Nickel silicide having a $NiSi_2$ concentration of less than about 10 percent; and
a metal alloy layer on the silicide layer.

13. A semiconductor device comprising:
a substrate having a channel region;
a gate dielectric layer on the substrate and over the channel region;
a gate electrode on the gate dielectric layer;
source/drain regions substantially aligned with respective edges of the gate electrode with the channel region therebetween; and
a conductive composite contact layer on the source/drain regions and on the gate electrode, the conductive composite contact layer comprising:
a silicide layer comprising Nickel silicide or Cobalt silicide;
a metal alloy layer comprising Nickel alloy or Cobalt alloy on the silicide layer; and
a contact plug contacting the metal alloy layer.

14. The semiconductor device of claim 13 wherein the silicide layer has a thickness of less than about 50 Å.

15. The semiconductor device of claim 13 wherein the metal alloy layer further comprises a material selected from the group consisting essentially of phosphorus, boron, palladium, tungsten, molybdenum, rhenium, and combinations thereof.

16. The semiconductor device of claim 13 wherein the metal alloy layer has a Cobalt or Nickel concentration of higher than about 80 atomic percent.

17. The semiconductor device of claim 13 wherein the metal alloy layer has a thickness of less than about 150 Å.

18. A semiconductor device comprising:
a substrate having a channel region;
a gate dielectric layer on the substrate and over the channel region;
a gate electrode on the gate dielectric layer;
source/drain regions substantially aligned with respective edges of the gate electrode with the channel region therebetween; and
a conductive composite contact layer on the source/drain regions and on the gate electrode, the conductive composite contact layer comprising:
a silicide layer comprising Nickel silicide having a $NiSi_2$ concentration of less than about 10 percent; and
a metal alloy layer comprising Nickel alloy or Cobalt alloy on the silicide layer.

* * * * *